(12) United States Patent
Yu et al.

(10) Patent No.: US 7,863,110 B2
(45) Date of Patent: Jan. 4, 2011

(54) SEMICONDUCTOR DEVICE AND METHOD FOR FABRICATING THE SAME

(75) Inventors: Tea-Kwang Yu, Suwon-si (KR); Kong-Sam Jang, Yongin-si (KR); Kwang-Tae Kim, Suwon-si (KR); Ji-Hoon Park, Seoul (KR); Eun-Mi Hong, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 347 days.

(21) Appl. No.: 11/907,994

(22) Filed: Oct. 19, 2007

(65) Prior Publication Data

US 2008/0093701 A1    Apr. 24, 2008

(30) Foreign Application Priority Data

Oct. 23, 2006    (KR) .................. 10-2006-0103156

(51) Int. Cl.
*H01L 21/332* (2006.01)
*H01L 31/119* (2006.01)
*H01L 23/58* (2006.01)

(52) U.S. Cl. .................. 438/140; 257/409; 257/495

(58) Field of Classification Search ................ 257/409, 257/490, 495, E29.049–E29.067, E29.256–E29.26; 438/140, 454
See application file for complete search history.

(56) References Cited

U.S. PATENT DOCUMENTS

| | | | |
|---|---|---|---|
| 4,871,686 A | 10/1989 | Davies | |
| 5,250,834 A * | 10/1993 | Nowak | ......................... 257/350 |
| 5,444,664 A | 8/1995 | Kuroda et al. | |
| 5,537,073 A | 7/1996 | Arimoto | |
| 6,268,626 B1 * | 7/2001 | Jeon | ........................... 257/335 |
| 7,369,379 B2 * | 5/2008 | Marr | ........................... 361/56 |

FOREIGN PATENT DOCUMENTS

| | | |
|---|---|---|
| JP | 07-029386 A | 1/1995 |
| JP | 2002-299465 | 10/2002 |
| JP | 2004-071677 | 3/2004 |
| JP | 2006-108272 | 4/2006 |
| KR | 10-1989-0015420 A | 10/1989 |
| KR | 10-1994-0010513 A | 9/1993 |

* cited by examiner

*Primary Examiner*—Calvin Lee
(74) *Attorney, Agent, or Firm*—Lee & Morse P.C.

(57) ABSTRACT

A semiconductor device includes a device isolation layer on a semiconductor substrate defining an active region in the semiconductor substrate, a low voltage well of a first conductivity type in the active region of the semiconductor substrate, a high voltage impurity region of a second conductivity type in the active region of the semiconductor substrate, the high voltage impurity region positioned in an upper portion of the low voltage well, a high concentration impurity region of the second conductivity type within the high voltage impurity region and spaced apart from the device isolation layer, and a floating impurity region of the first conductivity type between the device isolation layer and the high concentration impurity region, the floating impurity region being a portion of an upper surface of the active region.

20 Claims, 5 Drawing Sheets

SEMICONDUCTOR DEVICE AND METHOD FOR FABRICATING THE SAME

BACKGROUND OF THE INVENTION

1. Field of the Invention

Embodiments of the present invention relate to a semiconductor device and a method for fabricating a semiconductor device. More particularly, embodiments of the present invention relate to a semiconductor device capable of maintaining constant insulation breakdown voltage and a method of fabricating the same.

2. Description of the Related Art

In general, program and erase functions in a conventional memory device, e.g., an electrically erasable programmable read-only memory (EEPROM), may require a high voltage to be boosted to a predetermined level, e.g., 10V or a higher voltage. Such voltage control may be achieved by using a word line voltage generating circuit having a pumping circuit and a clamping circuit. The clamping circuit may include a semiconductor device, e.g., a clamp diode, employing an insulation breakdown voltage (BV) to perform clamping. However, the conventional clamp diode may exhibit a walkout occurrence.

More specifically, the walkout occurrence refers to a phenomenon, where a reverse bias in the conventional clamp diode may cause a junction avalanche breakdown, so that hot carriers generated in a depletion region of the clamp diode may be trapped in a silicon oxide layer thereof. Such an occurrence may weaken the electric field at the junction of the clamp diode, thereby increasing the insulation BV. However, an increased insulation BV may induce an increase in an output voltage in a gate electrode of a high voltage transistor, i.e., a select transistor of the memory device, e.g., above about 1V. Further, an increased insulation BV may increase an electric field of the gate electrode, which in turn, may trigger punch-through occurrences and increased leakage current in the clamp diode. As such, a memory device controlled by the conventional clamp diode may have reduced reliability, e.g., increased limitations in EEPROM devices that program in page mode.

SUMMARY OF THE INVENTION

The present invention is therefore directed to a semiconductor device and a method of fabricating the same, which substantially overcome one or more of the problems due to the limitations and disadvantages of the related art.

It is therefore a feature of an embodiment of the present invention to provide a semiconductor device capable of increasing reliability of a memory device.

It is another feature of an embodiment of the present invention to provide a method of fabricating a semiconductor device capable of increasing reliability of a memory device.

At least one of the above and other features of the present invention may be realized by providing a semiconductor device including a device isolation layer on a semiconductor substrate for defining an active region in the semiconductor substrate, a low voltage well of a first conductivity type in the active region of the semiconductor substrate, a high voltage impurity region of a second conductivity type in the active region of the semiconductor substrate, the high voltage impurity region positioned in an upper portion of the low voltage well, a high concentration impurity region of the second conductivity type within the high voltage impurity region and spaced apart from the device isolation layer, and a floating impurity region of the first conductivity type between the device isolation layer and the high concentration impurity region, the floating impurity region being a portion of an upper surface of the active region.

The floating impurity region may be within the high voltage impurity region. A portion of the high voltage impurity region may be between the floating impurity region and the high concentration impurity region. The device isolation layer may have a shallow trench isolation structure. The first conductivity type may be a P-type, and the second conductivity type may be an N-type. The low voltage well may include boron. The high voltage impurity region may include phosphorous. The high concentration impurity region may include arsenic. The high concentration impurity region may have a higher impurity concentration than the high voltage impurity region.

At least one of the above and other features of the present invention may be further realized by providing a method for fabricating a semiconductor device, including forming a device isolation layer in a semiconductor substrate to define an active region therein, forming a low voltage well of a first conductivity type within the active region of the semiconductor substrate, forming a high voltage impurity region of a second conductivity type within the active region in an upper portion of the low voltage well, forming a high concentration impurity region of the second conductivity type within the high voltage impurity region and spaced apart from the device isolation layer, and forming a floating impurity region of the first conductivity type between the device isolation layer and the high concentration impurity region, such that the floating impurity region is a portion of an upper surface of the active region.

Forming the floating impurity region may include forming a concentration gradient between the low voltage well and the high voltage impurity region. Forming the concentration gradient may include forming a higher impurity ion concentration in the high voltage impurity region than in the low voltage well. Forming the device isolation layer may include employing a shallow trench isolation method. The first conductivity type may be a P-type, and the second conductivity type may be an N-type. Forming the low voltage well may include forming a higher impurity concentration in an upper surface of the semiconductor substrate than in a lower surface thereof. Forming the high concentration impurity region includes forming a higher impurity concentration therein as compared to the high voltage impurity region.

Forming the low voltage well may include performing a first impurity implantation process using a boron impurity, energy of 100-200 k eV, and a concentration of $1.0-5.0\times10^{13}$ atoms/cm$^2$, performing a second impurity implantation process using a boron impurity, energy of 30-80 keV, and a concentration of $2.0-8.0\times10^{12}$ atoms/cm$^2$, and performing a third impurity implantation process using an indium impurity, energy of 140-200 keV, and a concentration of $1.0-8.0\times10^{12}$ atoms/cm$^2$. Forming the high voltage impurity region may include implanting phosphorous ions at an energy level of about 70-110 keV and a concentration of about $5.0-9.0\times10^{12}$ atoms/cm$^2$. Forming the high concentration impurity region may include forming a mask pattern on the active region to expose portions thereof spaced apart from the device isolation layer, and performing an ion implantation through the mask pattern. The ion implantation may include implanting arsenic ions at an energy level of about 40-60 keV and a concentration of about 4.0-6.0×10$^{15}$ atoms/cm$^2$.

BRIEF DESCRIPTION OF THE DRAWINGS

The above and other features and advantages of embodiments of the present invention will become more apparent to those of ordinary skill in the art by describing in detail exemplary embodiments thereof with reference to the attached drawings, in which.

DETAILED DESCRIPTION OF THE INVENTION

Figure 1:
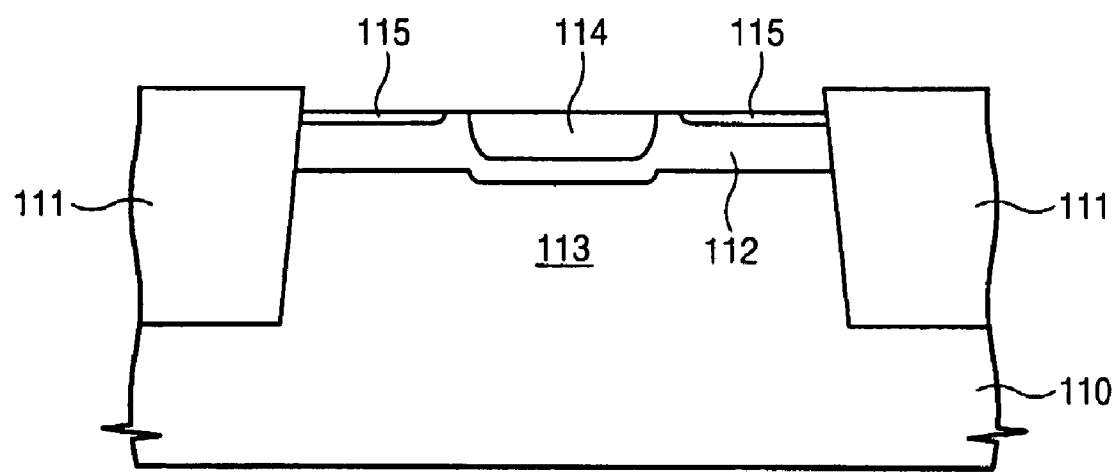
FIG. 1 illustrates a cross-sectional view of a semiconductor device according to an embodiment of the present invention.

Korean Patent Application No. 10-2006-0103156, filed on Oct. 23, 2006, in the Korean Intellectual Property Office, and entitled: "Semiconductor Device and Method for Fabricating the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an exemplary embodiment of a semiconductor device, e.g., a clamp diode, according to the present invention will be described in more detail below with reference to FIG. 1. It should be noted, however, that even though the semiconductor device of the present invention is illustrated as a clamp diode of a word line voltage generating circuit of a memory device, e.g., an electrically erasable programmable read-only memory (EEPROM), other implementations of the semiconductor device are within the scope of embodiments of the present invention.

As illustrated in FIG. 1, a semiconductor device may include a semiconductor substrate 110, a device isolation layer 111 on the semiconductor substrate 110 to define an active region therein, a low voltage (LV) well 113 within the active region of the semiconductor substrate 110, a high voltage impurity region 112 in an upper portion of the LV well 113, a high concentration impurity region 114 in the high voltage impurity region 112, and at least one floating impurity region 115 in the high voltage impurity region 112 and between the device isolation layer 111 and the high concentration impurity region 114.

The LV well 113 and the floating impurity region 115 may be of a first conductivity type. The high voltage impurity region 112 and high concentration impurity region 114 may be of a second conductivity type. Therefore, the LV well 113 and the high concentration impurity region 114 may form a PN junction. In this respect, it is noted that the first conductivity type may be a P-type, and the second conductivity type may be an N-type. Alternatively, the first conductivity type may be an N-type, and the second conductivity type may be a P-type. For consistency and ease of explanation only, the first and second conductivities in the semiconductor device according to embodiments of the present invention will be directed hereinafter to P-type and N-type conductivities, respectively.

The high concentration impurity region 114 may be formed in the high voltage impurity region 112, and may be spaced apart from the device isolation layer 111. The high concentration impurity region 114 may be formed in an upper portion of the high voltage impurity region 112 to define a portion of an upper surface of the active region, as illustrated in FIG. 1. The high concentration impurity region 114 may have a higher second impurity concentration, i.e., impurity concentration providing the second conductivity type, as compared to the second impurity concentration of the high voltage impurity region 112. Further, the high concentration impurity region 114 may have a higher impurity concentration than the LV well 113. In other words, the impurity concentration profile may decrease as a depth of the impurities increases in the active region.

The impurity concentration profile, i.e., impurity concentration difference between the LV well 113 and the high concentration impurity region 114, may form the floating impurity region 115 in the upper portion of the high voltage impurity region 112, as will be discussed in more detail below with respect to FIG. 2D. At least one floating impurity region 115 may be formed in the upper portion of the high voltage impurity region 112 to define a portion of an upper surface of the active region. The floating impurity region 115 may be thinner than the high concentration impurity region 114 with respect to a vertical axis, and may be positioned between the device isolation layer 111 and the high concentration impurity region 114. The floating impurity region 115 may be in contact with the device isolation layer 111, and may be separated from the high concentration impurity region 114 by a portion of the high voltage impurity region 112, as further illustrated in FIG. 1.

Formation of the floating impurity region 115 of the first conductivity type between the device isolation layer 111 and the high concentration impurity region 114 may increase a distance therebetween, thereby minimizing an avalanche current in the semiconductor device, i.e., concentrating the avalanche current substantially below a central portion of the PN junction. In other words, the avalanche current may occur only in an area directly under the high concentration impurity region 114, so that the walkout phenomenon effects on the semiconductor device may be substantially minimized, e.g., hot carriers may not be trapped in the device isolation layer 111.

Figure 2A:
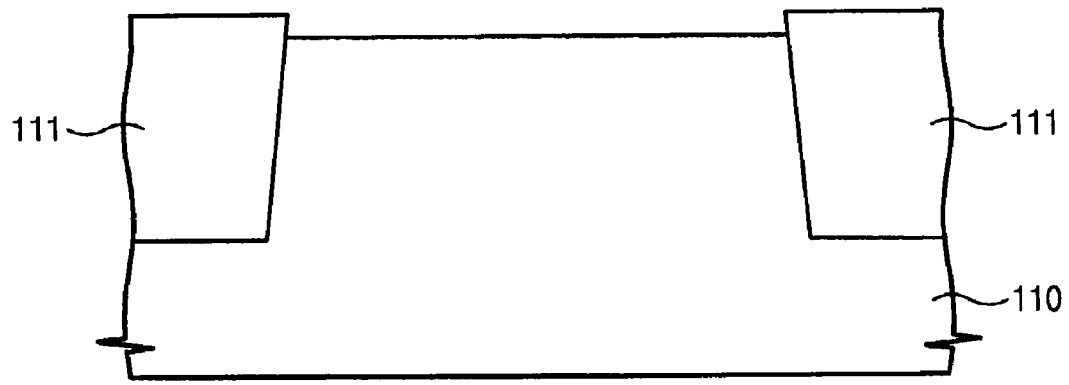
FIGS. 2A-2D illustrate cross-sectional views of stages during fabrication of the semiconductor device of FIG. 1.

A method of fabricating a semiconductor device according to an embodiment of the present invention will be described below with reference to FIGS. 2A-2D. As illustrated in FIG. 2A, a device isolation layer 111 may be formed in a semiconductor substrate 110 to define an active region therein. The device isolation layer 111 may be a non-continuous layer having at least two discrete segments, so that the active region may be formed therebetween. The device isolation layer 111 may be formed using, e.g., a shallow trench isolation (STI) method. The device isolation layer 111 may be formed to a predetermined depth in the semiconductor substrate 110, and may protrude vertically above an upper surface thereof.

Figure 2B:
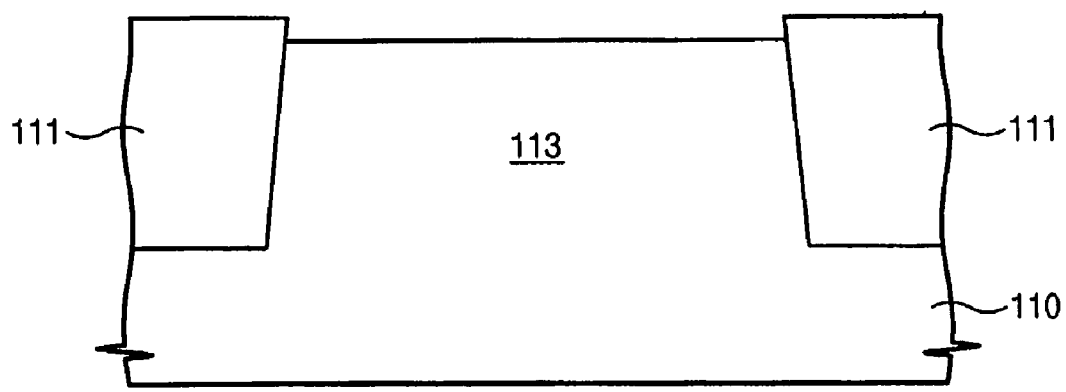

Next, as illustrated in FIG. 2B, a low voltage (LV) well 113 may be formed in the active region of the semiconductor substrate 110 to have a first conductivity. More specifically, at least one first impurity may be implanted at different depths and concentrations into the semiconductor substrate 110 to form a decreasing impurity concentration profile with respect to an impurity depth in the semiconductor substrate 110. Accordingly, the impurity concentration in the LV well 113 may decrease as a depth of the LV well 113 increases.

For example, a first predetermined amount of the first impurity, e.g., boron (B), may be implanted in the semiconductor substrate 110 at an energy level of about 100-200 keV and a concentration of about $1.0$-$5.0 \times 10^{13}$ atoms/cm$^2$ to form a deep LV P-type well (LV P-well). Next, a second predetermined amount of the first impurity may be implanted in the upper portion of the deep LV P-well at an energy level of about 30-80 keV and a concentration of about $2.0$-$8.0 \times 10^{12}$ atoms/cm$^2$, followed by additional implanting of, e.g., indium (In), therein at an energy level of about 140-200 keV and a concentration of about $1.0$-$8.0 \times 10^{12}$ atoms/cm$^2$ in order to increase the impurity concentration in the upper portion of the semiconductor substrate 110, i.e., increase the impurity concentration in an upper surface of the LV P-well as compared to a lower surface thereof.

Figure 2C:
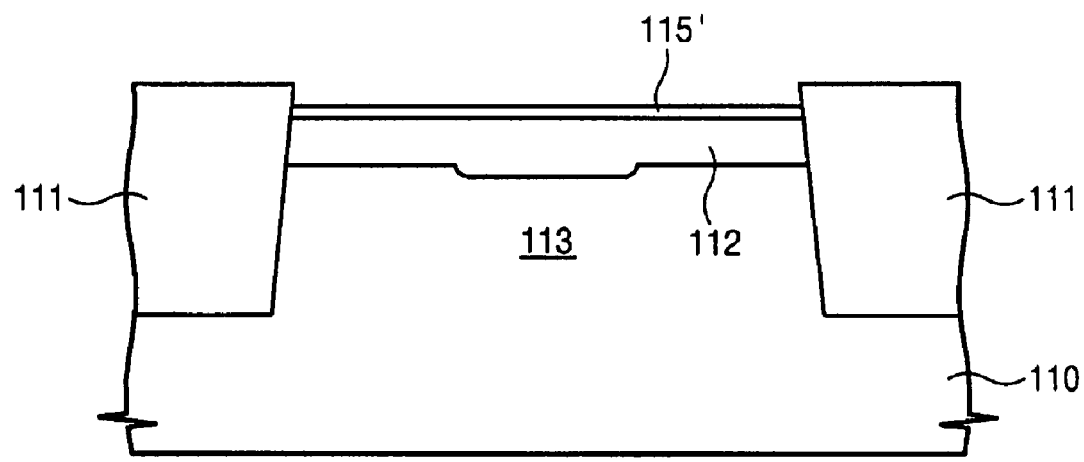

Next, as illustrated in FIG. 2C, a high voltage impurity region 112 may be formed in an upper portion of the active region of the LV well 113, e.g., the LV P-well. More specifically, a second impurity, e.g., phosphorus (P), may be implanted in the upper portion of the active region of the LV well 113 at an energy level of, e.g., about 70-110 keV, and at a concentration of, e.g., about $5.0$-$9.0 \times 10^{12}$ atoms/cm$^2$. The second impurity may impart a conductivity of the second type to the high voltage impurity region 112. Further, formation of the high voltage impurity region 112 by implanting the second impurity in the upper portion of the LV well 113 may reverse the impurity concentration on the upper surface of the semiconductor substrate 110, thereby forming an impurity layer 115' having a first type conductivity on an entire upper surface of the high voltage impurity region 112, as further illustrated in FIG. 2C.

Figure 2D:
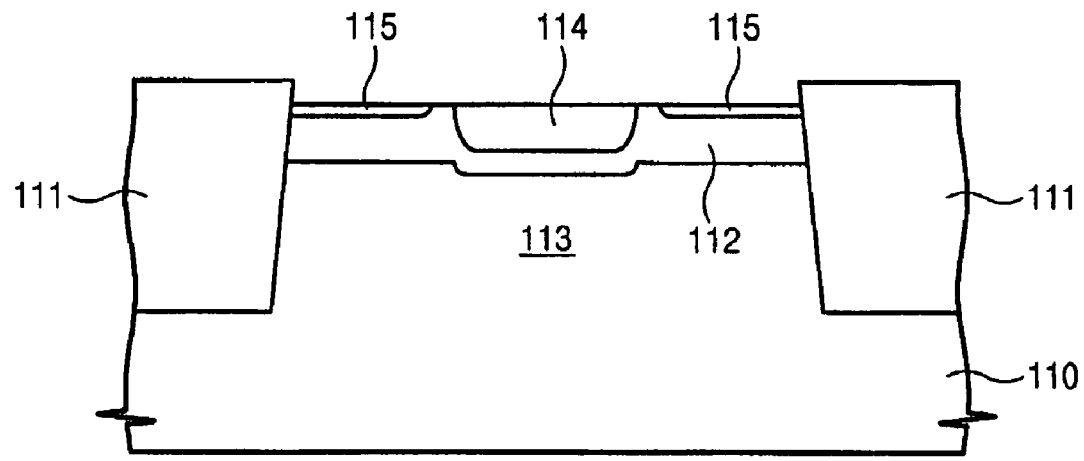

Subsequently, as illustrated in FIG. 2D, a high concentration impurity region 114 may be formed apart from the device isolation layer 111 in the high voltage impurity region 112. More specifically, a mask pattern (not shown), e.g., a photoresist, may be formed on the semiconductor substrate 110 to expose portions of the active region at a predetermined distance from the device isolation layer 111, followed by an ion implantation process using the mask pattern as an impurity implantation mask in order to form the high concentration impurity region 114. The ion implantation process may include, e.g., implanting arsenic (As) with an energy level of about 40-60 keV to a concentration of about $4.0$-$6.0 \times 10^{15}$ atoms/cm$^2$.

The high concentration impurity region 114 may have a higher impurity concentration than that of the high voltage impurity region 112. Also, the high concentration impurity region 114 may have a higher impurity concentration than that of the impurity layer 115'. Therefore, the floating impurity region 115 may be formed in the impurity layer 115' between the device isolation layer 111 and the high concentration impurity region 114, as illustrated in FIG. 2D. The floating impurity region 115 may be formed so that a portion of the high voltage impurity region 112 may protrude to the surface of the semiconductor substrate 110 between the high concentration impurity region 114 and the floating impurity region 115, as further illustrated in FIG. 2D. Formation of the floating impurity region 115 with the first conductivity between the device isolation layer 111 and the high concentration impurity region 114 may concentrate the avalanche current flow substantially below the PN junction, thereby minimizing or preventing walkout occurrence of the semiconductor device.

Figure 3:
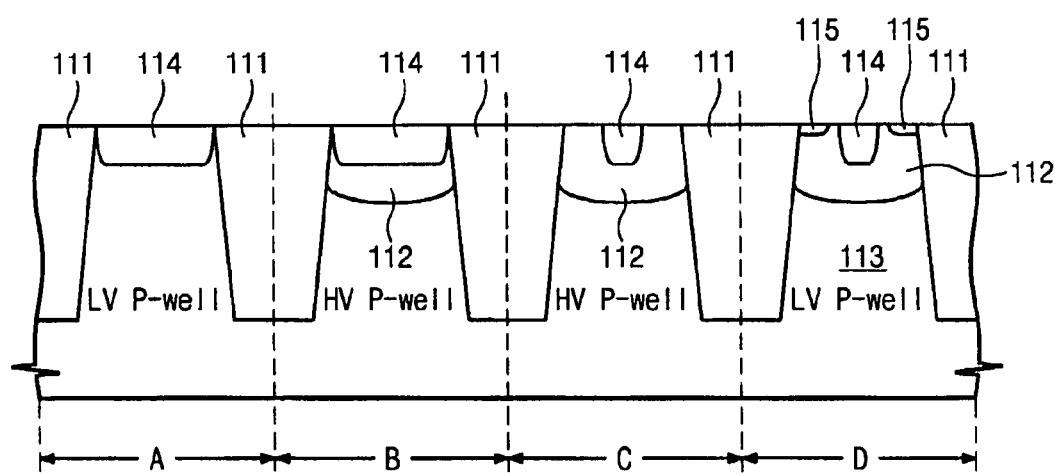
FIG. 3 illustrates a cross-sectional view of a memory device including a semiconductor device according to an embodiment of the present invention.

According to another embodiment of the present invention illustrated in FIG. 3, a memory device, e.g., an electrically erasable programmable read-only memory (EEPROM), may include a low voltage device region (A), a mid voltage device region (B), a high voltage device region (C), and an output voltage clamp diode region (D). Further, the memory device may include device isolation layers 111 for defining the active regions of each region A through D. The output voltage clamp diode region (D) may include the semiconductor device described previously with respect to FIGS. 1 and 2A-2D.

The low voltage device region (A) of the memory device may include logic devices, and may be operated by application of voltage of about 1.8 V. The low voltage device region (A) may include a low voltage (LV) well, e.g., P-type well (LV P-well), and the high concentration impurity region 114 on the entire surface of the active region of the low voltage device region (A), i.e., in communication with the isolation layers 111.

The mid voltage device region (B) may include I/O buffer devices, and may be operated by application of voltage of about 5.0 V. The mid voltage device region (B) may include, e.g., a high voltage P-type well (HV P-well), the high voltage impurity region 112, and the high concentration impurity region 114. More specifically, the high concentration impurity region 114 may be formed in an upper portion of the high voltage impurity region 112 and in communication with the isolation layers 111, so that the upper surface of the active region may include only the high concentration impurity region 114, as illustrated in FIG. 3.

The high voltage device region (C) may include at least one cell, and may be operated by a voltage of about 18 V. The high voltage device region (C) may include, e.g., the high voltage P-type well (HV P-well), the high voltage impurity region 112, and the high concentration impurity region 114. The high concentration impurity region 114 may be formed in the upper portion of the high voltage impurity region 112, so that the upper surface of the active region may include the high concentration impurity region 114 and the high voltage impurity region 112, i.e., the high concentration impurity region 114 may not be in communication with the isolation layers 111, as illustrated in FIG. 3.

The output voltage clamp diode region (D) may include a clamp diode, and may be operated by a voltage of about 12 V. The output voltage clamp diode region (D) may include the LV well 113, e.g., LV P-well, the high voltage impurity region 112, the high concentration impurity region 114 on the active region spaced apart from the device isolation layer 111, and the floating impurity region 115. The output voltage clamp diode region (D) may be the semiconductor device described previously with respect to FIGS. 1 and 2A-2D, and therefore, its detailed description will not be repeated herein.

The memory device illustrated in FIG. 3 may be advantageous because the method of forming the output voltage clamp diode region (D) may be substantially similar to a method used for forming the high voltage device region (C), thereby avoiding an increased number of required mask patterns during fabrication thereof. Additionally, because only one output voltage clamp diode region (D), i.e., clamp diode, may be required in a memory device, e.g., EEPROM, there may be a reduced number of limitations on the design rule (D/R) thereof, e.g., a distance between each side of the high concentration impurity region 114 to an adjacent respective side of the device isolation layer 111. For example, when a total width of the active region of the output voltage clamp diode region (D) is about 1.5 µm, a width of the high concentration impurity region 114 and a distance between sides of the high concentration impurity region 114 to a corresponding adjacent sides of the device isolation layer 111 may be respectively about 0.2 µm to about 0.5 µm and about 0.5 µm to about 1.0 µm, thereby facilitating formation of the floating impurity region 115 therebetween.

EXAMPLE

A semiconductor device, e.g., a clamp diode, according to an embodiment of the present invention was compared to a conventional clamp diode for a word line voltage generating circuit in an EEPROM. More specifically, an insulation breakdown voltage (BV) in each of the clamp diodes was measured while program/erase functions were repeated for a duration of about 40,000 seconds. The measurement results were plotted in graphs illustrated in FIGS. 4A-4B.

Figure 4A:
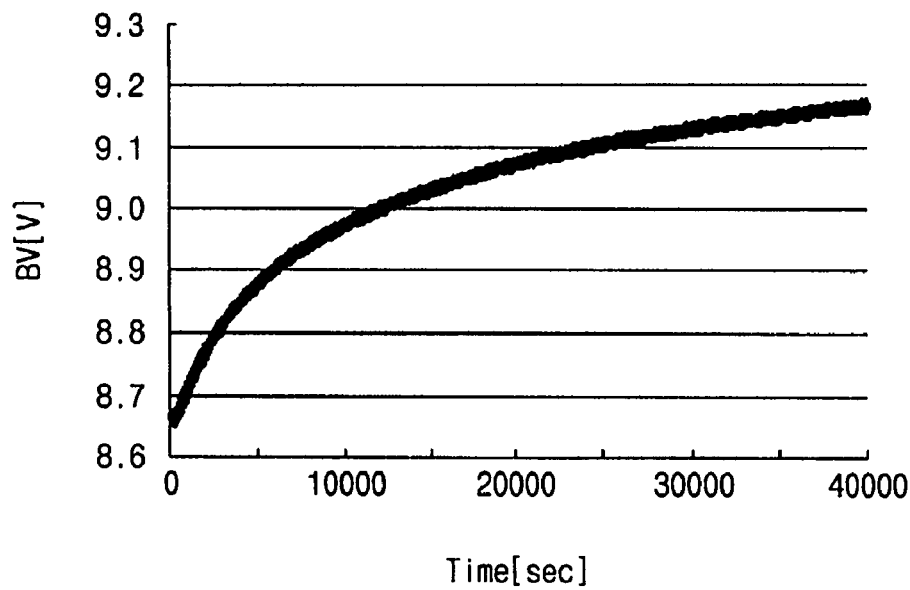
FIGS. 4A-4B illustrate graphs of an insulation breakdown voltage with respect to time in a conventional clamp diode and the semiconductor device of FIG. 1, respectively.
Figure 4B:
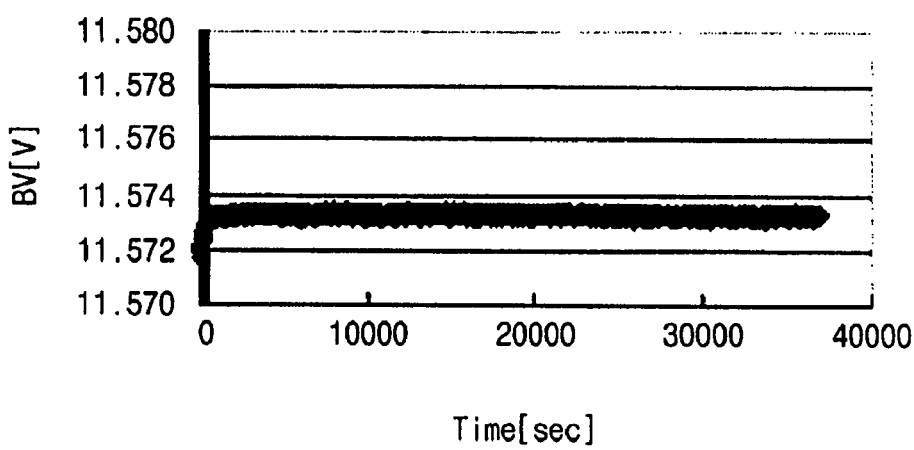

As illustrated in FIG. 4A, the insulation BV of the conventional clamp diode showed a constant increase with respect to increased stress duration, so that in a time period of 40,000 seconds the insulation BV increased by about 0.5 V. On the other hand, as illustrated in FIG. 4B, the insulation BV of the semiconductor device according to an embodiment of the present invention showed a substantially constant insulation BV over most of the 40,000 seconds. More specifically, after an increase of about 0.002 V within the first few tens of seconds, the insulation BV of the semiconductor device according to an embodiment of the present invention remained substantially constant throughout the measurement. Accordingly, as illustrated in FIGS. 4A-4B, the semiconductor device according to an embodiment of the present invention may be advantageous in being capable of minimizing or substantially preventing the walkout phenomenon and maintaining a substantially constant insulation BV.

The semiconductor device according to embodiments of the present invention may be advantageous in concentrating the avalanche current flow substantially below the PN junction, thereby maintaining a constant insulation BV and minimizing walkout occurrence therein. Such a semiconductor device may provide a memory device, e.g., EEPROM, with a constant output voltage, minimized defects, e.g., punch-through, and improved reliability.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for fabricating a semiconductor device, comprising:
    forming a device isolation layer in a semiconductor substrate to define an active region therein;
    forming a low voltage well of a first conductivity type within the active region of the semiconductor substrate;
    forming a high voltage impurity region of a second conductivity type within the active region in an upper portion of the low voltage well;
    forming a high concentration impurity region of the second conductivity type within the high voltage impurity region and spaced apart from the device isolation layer; and
    forming a floating impurity region of the first conductivity type between the device isolation layer and the high concentration impurity region, such that the floating impurity region is a first portion of an upper surface of the active region and is spaced apart from the high concentration impurity region,
    wherein a portion of the high voltage impurity region is between the floating impurity region and the high concentration impurity region and is a second portion of the upper surface of the active region.

2. The method as claimed in claim 1, wherein forming the floating impurity region includes forming a concentration gradient between the low voltage well and the high voltage impurity region.

3. The method as claimed in claim 2, wherein forming the concentration gradient includes forming a higher impurity ion concentration in the high voltage impurity region than in the low voltage well.

4. The method as claimed in claim 1, wherein forming the device isolation layer includes employing a shallow trench isolation method.

5. The method as claimed in claim 1, wherein the first conductivity type is a P-type, and the second conductivity type is an N-type.

6. The method as claimed in claim 1, wherein forming the low voltage well includes forming a higher impurity concentration in an upper surface of the semiconductor substrate than in a lower surface thereof.

7. The method as claimed in claim 6, wherein forming the low voltage well includes:
    performing a first impurity implantation process using a boron impurity, energy of 100-200 k eV, and a concentration of $1.0\text{-}5.0\times10^{13}$ atoms/cm$^2$;
    performing a second impurity implantation process using a boron impurity, energy of 30-80 keV, and a concentration of $2.0\text{-}8.0\times10^{12}$ atoms/cm$^2$; and
    performing a third impurity implantation process using an indium impurity, energy of 140-200 keV, and a concentration of $1.0\text{-}8.0\times10^{12}$ atoms/cm$^2$.

8. The method as claimed in claim 1, wherein forming the high voltage impurity region includes implanting phosphorous ions at an energy level of about 70-110 keV and a concentration of about $5.0\text{-}9.0\times10^{12}$ atoms/cm$^2$.

9. The method as claimed in claim 1, wherein forming the high concentration impurity region includes:
    forming a mask pattern on the active region to expose portions thereof spaced apart from the device isolation layer; and
    performing an ion implantation through the mask pattern.

10. The method as claimed in claim 9, wherein the ion implantation includes implanting arsenic ions at an energy level of about 40-60 keV and a concentration of about $4.0\text{-}6.0\times10^{"}$ atoms/cm$^2$.

11. The method as claimed in claim 1, wherein forming the high concentration impurity region includes forming a higher impurity concentration therein as compared to the high voltage impurity region.

12. A semiconductor device, comprising:
    a device isolation layer on a semiconductor substrate defining an active region in the semiconductor substrate;

a low voltage well of a first conductivity type in the active region of the semiconductor substrate;

a high voltage impurity region of a second conductivity type in the active region of the semiconductor substrate, the high voltage impurity region positioned in an upper portion of the low voltage well;

a high concentration impurity region of the second conductivity type within the high voltage impurity region and spaced apart from the device isolation layer; and a floating impurity region of the first conductivity type between the device isolation layer and the high concentration impurity region, the floating impurity region being a first portion of an upper surface of the active region and being spaced apart from the high concentration impurity region, wherein a portion of the high voltage impurity region is between the floating impurity region and the high concentration impurity region and is a second portion of the upper surface of the active region.

13. The semiconductor device as claimed in claim 12, wherein the floating impurity region is within the high voltage impurity region.

14. The semiconductor device as claimed in claim 12, wherein the device isolation layer has a shallow trench isolation structure.

15. The semiconductor device as claimed in claim 12, wherein the first conductivity type is a P-type, and the second conductivity type is an N-type.

16. The semiconductor device as claimed in claim 15, wherein the low voltage well includes boron.

17. The semiconductor device as claimed in claim 15, wherein the high voltage impurity region includes phosphorous.

18. The semiconductor device as claimed in claim 15, wherein the high concentration impurity region includes arsenic.

19. The semiconductor device as claimed in claim 12, wherein the high concentration impurity region has a higher impurity concentration than the high voltage impurity region.

20. The semiconductor device as claimed in claim 12, wherein:

the high concentration impurity region is a third portion of the upper surface of the active region, and the first portion, the second portion, and the third portion of the upper surface of the active region are sequentially arranged to form a continuous surface.

* * * * *